United States Patent
Clausse et al.

(10) Patent No.: US 6,611,136 B2
(45) Date of Patent: Aug. 26, 2003

(54) DEVICE FOR DETERMINING THE PRIMARY CURRENT OF A CURRENT TRANSFORMER COMPRISING SATURATION CORRECTION MEANS

(75) Inventors: Christine Clausse, Grenoble (FR); Benoît Leprettre, Saint Martin d'Hères (FR); Marc Pouillot, Sassenage (FR); Paul Pianu, Meylan (FR)

(73) Assignee: Schneider Electric Industries SA (FR)

( * ) Notice: Subject to any disclaimer, the term of this patent is extended or adjusted under 35 U.S.C. 154(b) by 47 days.

(21) Appl. No.: 10/005,159

(22) Filed: Dec. 7, 2001

(65) Prior Publication Data

US 2002/0074991 A1 Jun. 20, 2002

(30) Foreign Application Priority Data

Dec. 20, 2000 (FR) .............................. 00 16640

(51) Int. Cl.$^7$ .............................. G01R 19/00
(52) U.S. Cl. ................ 324/117 R; 324/127; 324/117 H
(58) Field of Search ........................ 324/117 R, 117 H, 324/120, 252, 127, 158.1, 249, 141, 142, 96; 330/8; 336/175

(56) References Cited

U.S. PATENT DOCUMENTS 4,520,311 A * 5/1985 Petr et al. ............... 324/117 R
6,072,310 A * 6/2000 Krebs et al. ............ 324/117 R

FOREIGN PATENT DOCUMENTS

WO         93 13581        7/1993

* cited by examiner

*Primary Examiner*—Kamand Cuneo
*Assistant Examiner*—Jimmy Nguyen
(74) *Attorney, Agent, or Firm*—Parkhurst & Wendel, L.L.P.

(57) ABSTRACT

The device comprises modelling means representative of an inverse model of the current transformer. These modelling means receive on input the instantaneous values of the secondary current measured in a first secondary winding of the current transformer and, by means of an integrator, the integral of the secondary voltage measured at the terminals of a secondary winding of the current transformer. The modelling means supply on output the instantaneous values of the associated primary current, corrected in case of saturation of the transformer. The secondary voltage can be supplied by the first secondary winding or by an additional second secondary winding, arranged around the first one.

9 Claims, 4 Drawing Sheets

DEVICE FOR DETERMINING THE PRIMARY CURRENT OF A CURRENT TRANSFORMER COMPRISING SATURATION CORRECTION MEANS

BACKGROUND OF THE INVENTION

The invention relates to a device for determining the primary current of a current transformer, comprising digital processing means having a first input receiving measured instantaneous values of the secondary current of the transformer and an output supplying the instantaneous values of the associated primary current, corrected in case of saturation of the transformer.

STATE OF THE ART

Numerous devices, in particular trip devices of electrical circuit breakers, use current transformers to measure the electrical current in a conductor, either for measuring purposes or for protection purposes. Problems of saturation of the magnetic circuit of a current transformer make it necessary either to overdimension the transformer, which gives rise to problems of volume and cost, or to attempt to correct the effects due to saturation.

A certain number of digital processing methods of the secondary current, which current may be deformed, flowing in a secondary winding of a current transformer have been proposed. The document WO-A-9313581, for example, describes a device enabling corrected primary and secondary currents to be obtained from measured secondary current samples by using at least one saturated current transformer model and one non-saturated current transformer model, and a model of the current primary signals. More recently, the document EP-A-980129 recommended the use of neuron networks performing an inverse transfer function of a current transformer taking the effects of possible saturation of the transformer into account. The neuron network receives on input the secondary current, which may be deformed, flowing in the secondary winding of the current transformer and supplies on output a value representative of the corresponding current to be measured flowing in the primary winding of the transformer.

In practice, known devices only operate correctly if the current to be measured is perfectly sinusoidal. Moreover, as the secondary current is greatly dependent on the load connected to the secondary winding of the transformer, the current transformer can not be used to supply the electronic components of the device.

SUMMARY OF THE INVENTION

The object of the invention is to remedy these shortcomings and to provide a device enabling a precise determination of the primary current, even in case of saturation of the transformer, whatever the form of the current, while tolerating large load variations on the transformer secondary.

According to the invention, this object is achieved by the fact that the digital processing means comprise a second input receiving a secondary voltage measured at the terminals of a secondary winding of the current transformer and connected to the input of integrating means supplying signals representative of the instantaneous magnetic flux in the secondary winding of the transformer, modelling means representative of an inverse model of the current transformer and comprising first and second inputs and an output, the first input of the modelling means being connected to the first input of the digital processing means, the second input of the modelling means being connected to the output of the integrating means and the output of the modelling means being connected to the output of the digital processing means.

The modelling means are preferably formed by a numerical table with two inputs. The device according to the invention does not, in this case, require a great computing power, unlike devices of the prior art.

According to a first development of the invention the transformner comprises a first secondary winding supplying the instantaneous values of the secondary current, and a second, open, secondary winding arranged around the first secondary winding and supplying the secondary voltage applied to the second input of the processing means.

According to a second development of the invention, the transformer comprises a secondary winding supplying the instantaneous values of the secondary current and of the secondary voltage, the digital processing means comprising multiplying means connected to the first input of the digital processing means to multiply the secondary current by a quantity representative of the resistance of the secondary winding of the current transformer, summing means connected to the output of the multiplying means and to the second input of the digital processing means, the output of the summing means being connected to the input of the integrating means.

BRIEF DESCRIPTION OF THE DRAWINGS

Other advantages and features will become more clearly apparent from the following description of particular embodiments of the invention, given as non-restrictive examples only and represented in the accompanying drawings in which.

DETAILED DESCRIPTION OF A PREFERRED EMBODIMENT

Figure 1:
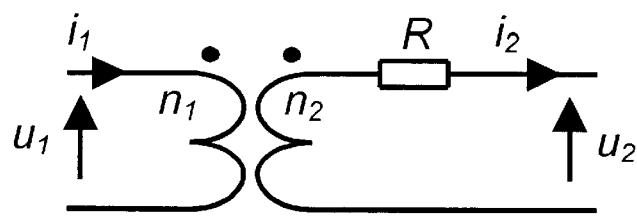
FIG. 1 represents a wiring diagram of a current transformer.

The transformer according to FIG. 1 comprises, in conventional manner, a primary winding comprising $n_1$ turns, wherein a primary current $i_1$ flows. A primary voltage $u_1$ is developed at the terminals thereof. The primary winding is magnetically coupled by a magnetic core (not represented), possibly with air-gaps, to a secondary winding having a resistor R and comprising $n_2$ turns. A current $i_2$ flows in the secondary winding and a secondary voltage $u_2$ is developed at the terminals thereof.

Figure 2:
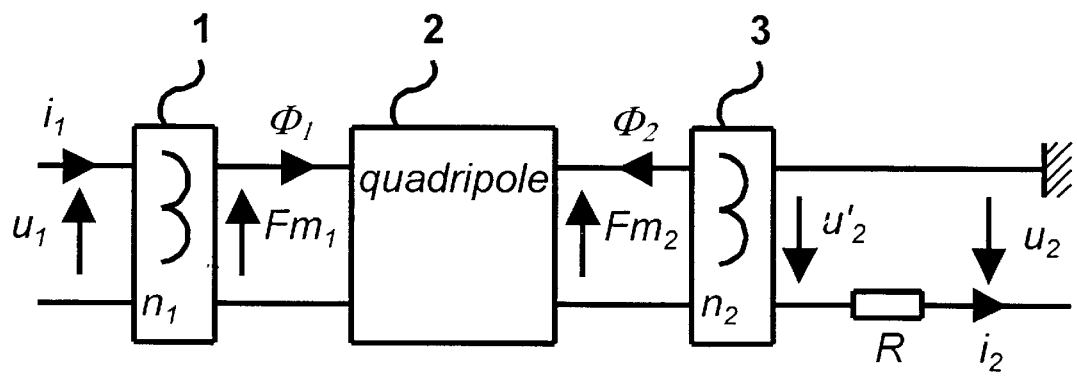
FIG. 2 represents an equivalent diagram of the transformer according to FIG. 1.

According to FIG. 2, operation of the transformer according to FIG. 1 can be represented in the form of a model constituted by an input quadripole 1, representing the primary winding considered as being ideal, connected in series with a quadripole 2, representing the assembly formed by the magnetic core and the air-gaps of the transformers, with an output quadripole 3, representing the secondary winding considered as being ideal, and with the resistor R of the secondary winding.

The input signals of the quadripole 1 are electrical signals constituted by the primary current $i_1$ and the primary voltage $u_1$. The output signals of the input quadripole 1, which constitute the input signals of the quadripole 2, are magnetic quantities constituted by the magnetic flux $\emptyset_1$ flowing through the primary winding and by the magnetomotive force $Fm_1$ associated with the primary winding. In known manner, the relations between the input electrical signals and the output magnetic quantities of the input quadripole 1 are given by:

$$Fm_1 = n_1 i_1$$

$$u_1 = n_1 d\emptyset_1/dt$$

The output signals of the quadripole 2, which constitute the input signals of the output quadripole 3, are likewise constituted by the magnetic flux $\emptyset_2$ flowing through the secondary winding and the magnetomotive force $Fm_2$ associated with the secondary winding. The output signals of the output quadripole 3 are constituted by the secondary current $i_2$ and by an intermediate secondary voltage $u'_2$, that would be present at the terminals of a secondary winding of zero resistance. The relations between the input magnetic quantities and the output electrical signals of the output dipole 3 are given by:

$$Fm_2 = n_2 i_2$$

$$u'_2 = -n_2 d\emptyset_2/dt$$

with $u'_2 = u_2 + Ri_2$, to take account of the non zero resistance of the secondary winding.

The quadripole 2 is formed by static dipoles and a single function $Fm_2(\emptyset_2, Fm_1)$ exists. The function $Fm_2(\emptyset_2, Fm_1)$ can be tabulated in the form of a table with two inputs and one output fully characterizing the quadripole 2, i.e. the magnetic circuit of the transformer with its non-linearities and its leaks. As the curves characteristic of the dipoles which make up the quadripole (air-gaps, iron core) are all symmetrical with respect to zero, the table is symmetrical with respect to the origin. This enables the memory required for storage thereof to be divided by two.

Figure 3:
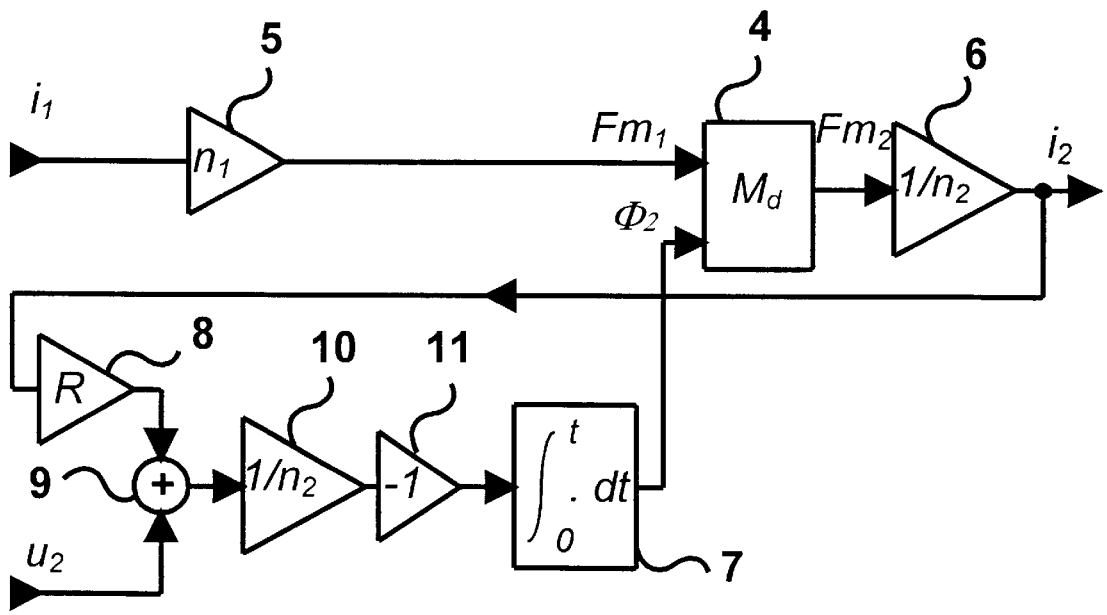
FIGS. 3 and 4 respectively represent direct and inverse modelling schemes of a current transformer.

We can go on from FIG. 2 to a direct modelling scheme of a current transformer illustrated in FIG. 3 in block diagram form. A first input of a unit 4, representative of a direct transformer model (Md), is connected to a first input of the direct modelling scheme receiving signals representative of the primary current $i_1$ by means of a first multiplying unit 5 represented in the form of an amplifier unit of gain $n_1$ supplying a quantity representative of the magnetomotive force $Fm_1$. The output of the unit 4, representative of the magnetomotive force $Fm_2$, is connected to the output of the direct modelling scheme supplying signals representative of the secondary current $i_2$ by means of a second multiplying unit 6 represented in the form of an amplifier unit of gain $1/n_2$. A second input of the unit 4 is connected to the output of an integrating unit 7. The output of the second multiplying unit 6 is connected to the input of a third multiplying unit 8 represented in the form of an amplifier unit, of gain R. A summing unit 9 is connected respectively to the output of the third multiplying unit 8 and to a second input of the direct modelling scheme which receives signals representative of the secondary voltage $u_2$. The output of the summing unit 9 is connected to the input of the integrating unit 7 by means of a fourth multiplying unit 10 represented in the form of an amplifier unit, of gain $1/n_2$, in series with an inverting unit 11. It can be verified that the quantity thus obtained at the output of the integrating unit 7 and applied to the second input of the unit 4 is representative of the magnetic flux $\emptyset_2$.

Figure 4:
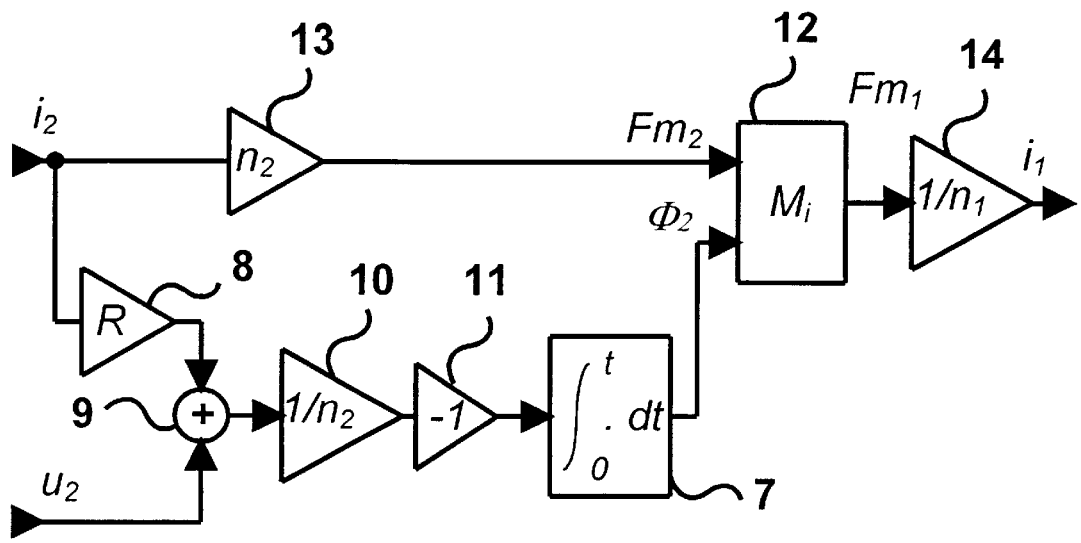

To obtain a determination of the primary current $i_1$, the direct modelling scheme can be inverted. The inverse modelling scheme illustrated in block diagram form in FIG. 4 is used. This enables the instantaneous values of the primary current $i_1$ to be determined from the instantaneous measurements of the secondary current $i_2$ and of the secondary voltage $u_2$. This model differs from the previous one in that it comprises a unit 12 representative of an inverse transformer model ($M_i$). A first input of the unit 12 is connected to a first input of the inverse modelling scheme, receiving signals representative of the secondary current $i_2$ by means of a fifth multiplying unit 13, represented in the form of an amplifier unit, of gain $n_2$, supplying a quantity representative of the magnetomotive force $Fm_2$. A second input of the unit 12 is connected to the output of the integrating unit 7, supplying, as in FIG. 3, a quantity representative of the magnetic flux $\emptyset_2$ formed from the signals $i_2$ and $u_2$ applied to first and second inputs of the inverse modelling scheme by means of the units 7, 8, 9, 10 and 11. The output of the unit 12, representative of the magnetomotive force $Fm_1$, is connected to the output of the inverse modelling scheme by means of a sixth multiplying unit 14 represented in the form of an amplifier unit of gain $1/n_1$. The basic inverse model ($M_i$) is based on the existence of a function F such that:

$$Fm_1 = F(\emptyset_2, Fm_2).$$

Figure 5:
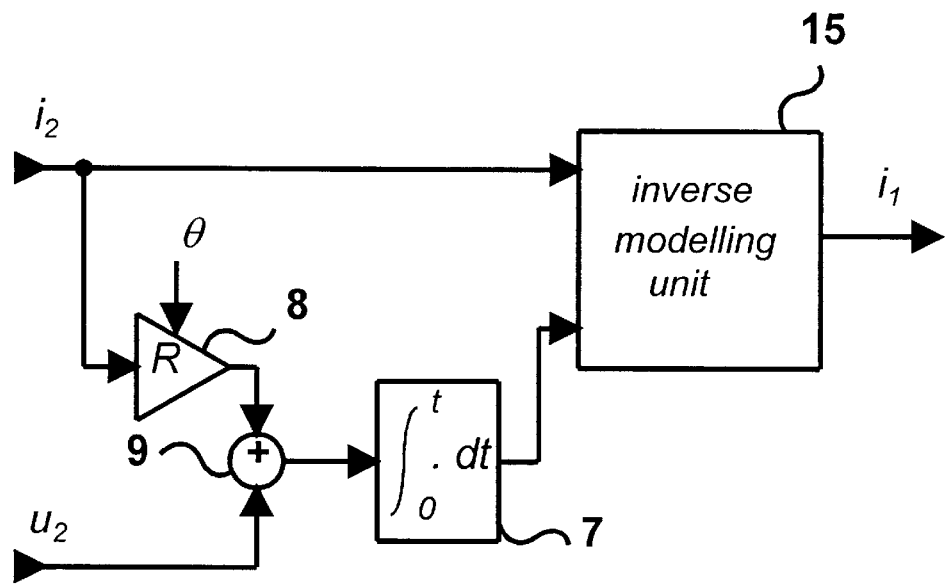
FIG. 5 illustrates a first embodiment of a device according to the invention.

In a preferred embodiment of the inverse modelling scheme represented in FIG. 5, the multiplying and inverting units 10, 11, 13 and 14 are integrated in an inverse modelling unit 15. In a first embodiment of a device according to the invention, a single secondary winding of $n_2$ turns (FIG. 1) supplies the instantaneous values of the secondary current $i_2$ and of the secondary voltage $u_2$ to first and second inputs of the digital processing means.

The digital processing means comprise the inverse modelling unit 15 having a first input receiving the instantaneous values of the secondary current $i_2$. The summing unit 9 is connected on the one hand to the second input of the digital processing means, receiving the secondary voltage $u_2$, and on the other hand to the first input of the digital processing means by means of the third multiplying unit 8. A second input of the inverse modelling unit 15 is connected to the output of the integrating unit 7, the input whereof is connected to the output of the summing unit 9. The output of the inverse modelling unit 15 constitutes the output of the digital processing means, supplying the instantaneous values of the current primary $i_1$ associated to the measured values $i_2$ and $u_2$.

In the current transformer, the resistance R of the secondary winding can vary greatly according to the temperature. For example the resistance variation can be about 40% in the temperature range accepted in the case of a circuit breaker.

In a preferred embodiment, the digital processing means comprise compensating means for compensating secondary winding temperature variations. In FIG. 5, these compensating means are represented in the form of an input for adjustment of the gain of the unit 8 according to the temperature Ø, which can be measured by any appropriate means. As the characteristics of variation of the resistance R of the secondary winding according to the temperature are known, the value of the gain R is modified according to the measured temperature.

To eliminate this resistance variation problem, the secondary winding of the transformer can also be made of a material whose resistivity is appreciably independent from the temperature, for example constantan.

Figure 6:
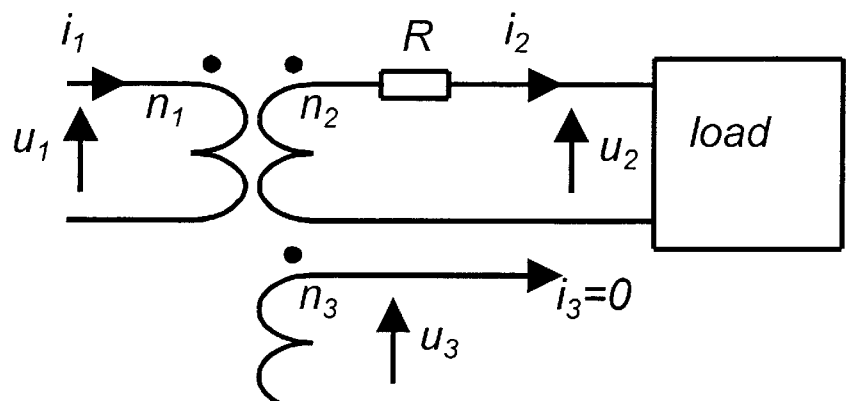
FIG. 6 represents the wiring diagram of a current transformer comprising two secondary windings.
Figure 7:
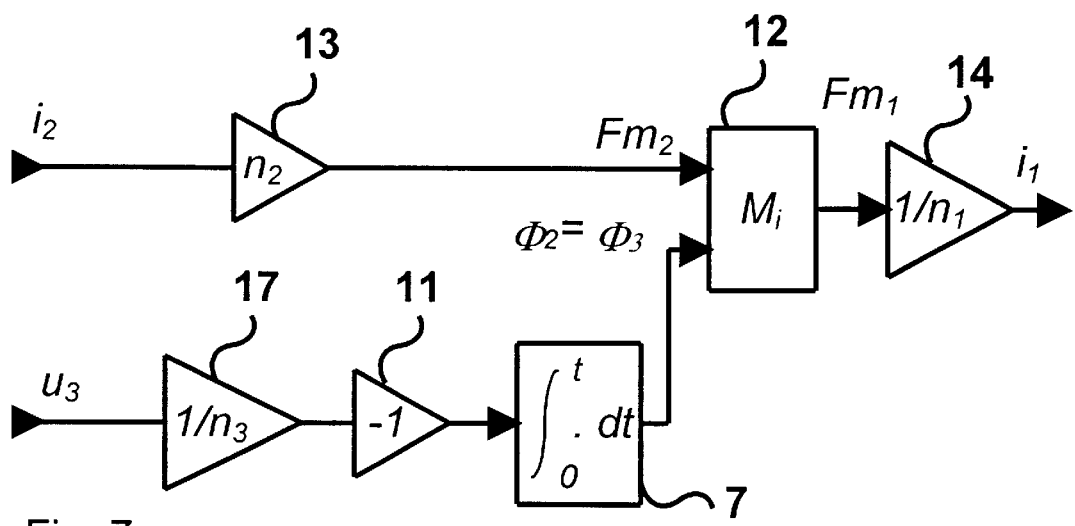
FIG. 7 illustrates an inverse modelling scheme of a current transformer according to FIG. 6.
Figure 8:
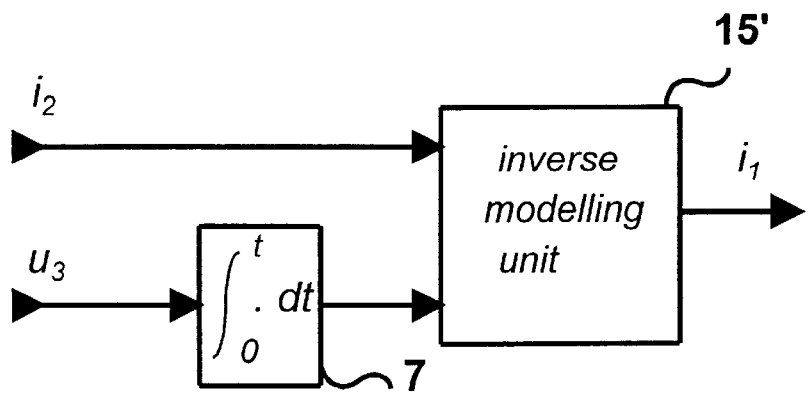
FIG. 8 represents a second embodiment of a device according to the invention used with a current transformer according to FIG. 6.

Another solution to this problem is provided by the embodiment represented in FIGS. 6 to 8 using two transformer secondary windings. A first secondary winding, of resistance R and comprising $n_2$ turns, supplies the instantaneous values of the secondary current $i_2$ as previously. This first secondary winding is normally connected (FIG. 6) to a load 16 at the terminals whereof a voltage $u_2$ develops. A second, open, secondary winding comprising $n_3$ turns supplies a secondary voltage $u_3$ designed to be applied to the second input of the digital processing means. As the second secondary winding is open, there is no current flowing therein ($i_3=0$). The second secondary winding is arranged around the first secondary winding so that there is the same magnetic flux $Ø_3=Ø_2$ flowing therein. As represented in FIG. 7, the secondary voltage $u_3$ measured at the terminals of the second secondary winding can then be used to reconstitute the input quantity representative of the secondary magnetic flux $Ø_2=Ø_3$ applied to the input of the unit 12. For this, a seventh multiplying unit 17, represented in the form of an amplifier unit of gain $1/n_3$, is connected in series with the inverting unit 11 and the integrating unit 7. The resistance of the first secondary winding no longer has to be taken into account for determining the magnetic flux and the resistance of the second secondary winding does not have any influence. Indeed, as the second secondary winding does not have any current flowing therein ($i_3=0$), it does not produce any magnetomotive force $Fm_3$.

The second secondary winding can be achieved with very fine wire and the number of turns $n_3$ thereof can be relatively small compared with the number of turns $n_2$ of the first secondary winding. The space taken up by the second secondary winding can therefore be very small.

In a similar manner to FIG. 5, in another preferred embodiment represented in FIG. 8, the multiplying and inverting units 11, 13, 14 and 17 of FIG. 7 can be integrated in an inverse modelling unit 15'.

In the modelling schemes of FIGS. 3, 4 and 7, and in the embodiments of FIGS. 5 and 8, the units 4, 12, 15 and 15' are preferably formed by numerical tables with two inputs and one output, the content whereof is obtained by interpolation from measurements made previously on a current transformer prototype.

The numerical tables can be obtained from measurements by any method in particular by successively using known smoothing, triangulation (for example using Delaunay's criterion), and interpolation methods, making use of the central symmetry property of the function F, and finally by simulation and testing.

In an embodiment of FIGS. 6 to 8, it has been assumed above that the coupling between the two secondary windings is ideal, i.e. that the same magnetic flux is flowing in the two secondary windings. The device according to the invention remains applicable even if this coupling is not ideal. The values of the inverse modelling unit 15' naturally then have to be computed accordingly. It can in fact be shown that a flux $Ø_3$ is flowing in the second secondary winding, which flux, although different from $Ø_2$, depends on an operating point defined by $Ø_2$ and $Fm_2$, the magnetomotive force $Fm_3$ associated to the second secondary winding being zero as the latter winding is in open circuit ($i_3=0$). A function G then exists such that: $Ø_3=G(Ø_2, Fm_2)$ and it becomes possible to express $Ø_2$ in terms of $Ø_3$ and $Fm_2$ and, consequently, $Fm_1$, in terms of $Ø_3$ and $Fm_2$. The tests leading to determining the values to be input in the inverse modelling unit 15' then have to take account of these characteristics and use a prototype wherein the coupling between the two secondary windings is predetermined, even if it is not ideal.

The use of an inverse transformer model taking into account not only the secondary current but also the secondary magnetic flux, by integration of the measured secondary voltage, thus enables the primary current to be determined from measurements of the secondary current and voltage even when the current transformer is saturated, whatever the form of the current. As an example, the device according to the invention supplies with a good precision the values of a current primary having the form of square signals of large amplitude implying a saturation of the current transformer. Likewise, the temperature variation compensation measurements enabled correct results to be obtained even with the resistance of the secondary winding being doubled according to the temperature conditions.

Figure 9:
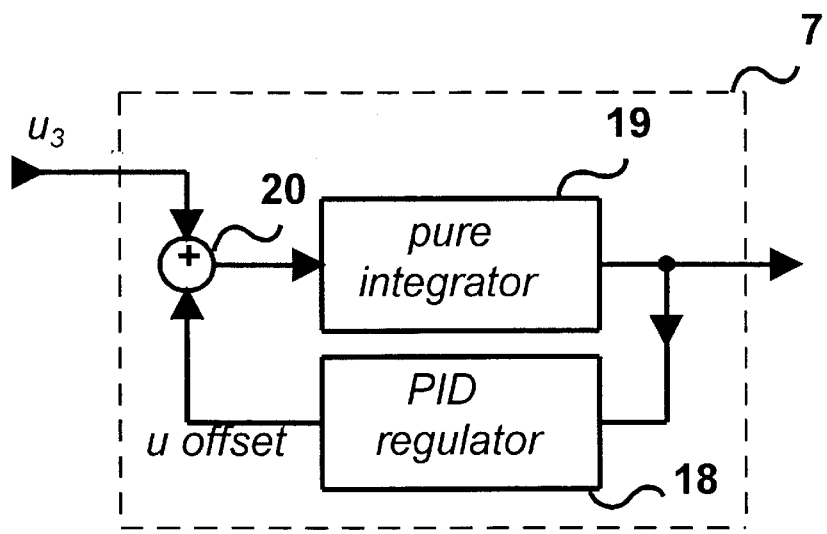
FIG. 9 represents in greater detail a particular embodiment of an integrating unit of a device according to the invention, comprising stabilizing means.
Figure 10:
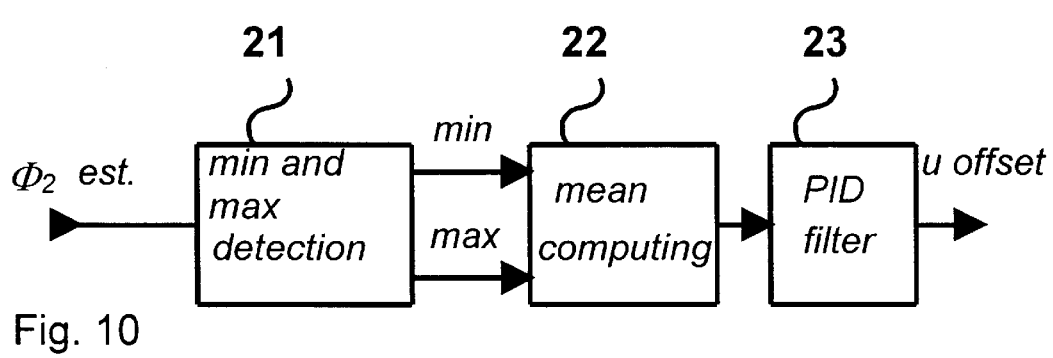
FIG. 10 represents in greater detail a particular embodiment of a regulating circuit of the integrating unit according to FIG. 9.

However, the device described may cause problems when a DC offset voltage, even a low one, is present at the terminals of the secondary winding. As the signals $u_2$ or $u_3$, and the signals $i_2$ in the case where a single secondary winding is used (FIGS. 1 to 5), are integrated in the integrating unit 7, the presence of such an offset voltage does in fact tend to make the value of the magnetic flux on output of the integrating unit, and consequently the estimated value of the primary current $i_1$ to be determined, diverge. To overcome this problem, the output of the integrating unit is stabilized by any suitable means. For example, the integrating unit stabilizing means can comprise a PID (proportional-integral-derivative) type regulating circuit as represented in FIG. 9. In this figure, the integrating unit 7 comprises an integrating circuit 19, a PID type regulating circuit 18 arranged between the output of the integrating circuit 19 and an input of a summing circuit 20, which receives on another input the input signal, $u_3$ in FIG. 9, of the integrating unit and the output whereof is connected to the input of the integrating circuit 19. The operation of this type of stabilizing means is well known and will not be described in greater detail. For example purposes, FIG. 10 illustrates a preferred embodiment of the regulating circuit 18 of FIG. 9. The latter comprises, in series, in known manner, a minimum and maximum detection circuit 21, a mean computation circuit 22 and a PID filter 23, so as to supply on output a value of the offset voltage u offset.

The invention is in no way limited to the stabilizing means described in FIGS. 9 and 10. For example, these stabilizing means can be formed by a short term integrator.

What is claimed is:

1. A device for determining the primary current of a current transformer, comprising digital processing means having a first input receiving measured instantaneous values of the secondary current of the transformer and an output supplying the instantaneous values of the associated primary current, corrected in case of saturation of the transformer, device wherein the digital processing means comprise a second input receiving a secondary voltage measured at the terminals of a secondary winding of the current transformer and connected to the input of integrating means supplying signals representative of the instantaneous magnetic flux in the secondary winding of the transformer, modelling means representative of an inverse model of the current transformer and comprising first and second inputs and an output, the first input of the modelling means being connected to the first input of the digital processing means, the second input of the modelling means being connected to the output of the integrating means and the output of the modelling means being connected to the output of the digital processing means.

2. The device according to claim 1, wherein the modelling means comprise a numerical table with two inputs.

3. The device according to claim 1, wherein the transformer comprises a first secondary winding supplying the instantaneous values of the secondary current, and a second, open, secondary winding, arranged around the first secondary winding and supplying the secondary voltage applied to the second input of the processing means.

4. The device according to claim 1, wherein the transformer comprises a secondary winding supplying the instantaneous values of the secondary current and of the secondary voltage, the digital processing means comprising multiplying means connected to the first input of the digital processing means to multiply the secondary current by a quantity representative of the resistance of the secondary winding of the current transformer, summing means connected to the output of the multiplying means and to the second input of the digital processing means, the output of the summing means being connected to the input of the integrating means.

5. The device according to claim 4, wherein the digital processing means comprise means for compensating the temperature variations of the secondary winding.

6. The device according to claim 4, wherein the secondary winding of the transformer is made of a material whose resistivity is appreciably independent from the temperature.

7. The device according to claim 6, wherein the material is constantan.

8. The device according to claim 1, wherein the integrating means comprise stabilizing means.

9. The device according to claim 8, wherein the stabilizing means comprise PID type regulating means.

* * * * *